(12) United States Patent
Takeuchi et al.

(10) Patent No.: US 7,309,644 B2
(45) Date of Patent: Dec. 18, 2007

(54) SYSTEM AND METHOD OF FABRICATION AND APPLICATION OF THIN-FILMS WITH CONTINUOUSLY GRADED OR DISCRETE PHYSICAL PROPERTY PARAMETERS TO FUNCTIONALLY BROADBAND MONOLITHIC MICROELECTRONIC OPTOELECTRONIC/SENSOR/ACTUATOR DEVICE ARRAYS

(75) Inventors: Ichiro Takeuchi, College Park, MD (US); Wei Yang, Hillsboro, OR (US); Kao-Shuo Chang, Greenbelt, MD (US); Ratnakar D. Vispute, Columbia, MD (US); Thirumalai Venky Venkatesan, Washington, DC (US)

(73) Assignee: University of Maryland, College Park, Riverdale, MD (US)

( * ) Notice: Subject to any disclaimer, the term of this patent is extended or adjusted under 35 U.S.C. 154(b) by 272 days.

(21) Appl. No.: 10/998,149

(22) Filed: Nov. 29, 2004

(65) Prior Publication Data

US 2006/0115588 A1   Jun. 1, 2006

(51) Int. Cl.
 *H01L 21/20* (2006.01)
(52) U.S. Cl. .................. 438/478; 257/21.09
(58) Field of Classification Search ............ 438/478, 438/507, 509; 257/E21.09; 427/255, 33
 See application file for complete search history.

(56) References Cited

U.S. PATENT DOCUMENTS

2003/0160176 A1* 8/2003 Vispute et al. .............. 250/372

2005/0029089 A1* 2/2005 Wang et al. ............ 204/192.12

OTHER PUBLICATIONS

Chang, K.S. et al., "Multimode Quantitative Scanning Microwave Microscopy of in situ Grown Epitaxial $Ba_{1-x}Sr_xTiO_3$ Composition Spreads", *Applied Physics Letters*, vol. 79, No. 26, Dec. 24, 2001, pp. 4411-4413.

Chen, C. et al., Combinatorial Ion Synthesis and Ion Beam Analysis of Materials Libraries, pp. 177-212.

Takeuchi, I. et al., "Monolithic Multichannel Ultraviolet Detector Arrays and Continuous Phase Evolution in $Mg_xZn_{1-x}O$ Composition Spreads", *Journal of Applied Physics*, vol. 94, No. 11, Dec. 1, 2003, pp. 7336-7340.

Takeuchi, I., et al., "Identification of Novel Compositions of Ferromagnetic Shape-Memory Alloys Using Composition Spreads", *Nature Materials*, vol. 2, Feb. 2003, pp. 180-184.

* cited by examiner

*Primary Examiner*—Bradley K. Smith
(74) *Attorney, Agent, or Firm*—Squire, Sanders & Dempsey, LLP

(57) ABSTRACT

A system and method are provided to fabricate thin-films having different physical property parameters or having physical property parameters that continuously change across functionally broadband monolithic device arrays. The fabrication method deposits the thin-film including layers on a substrate of a monolithic chip. The method defines a desired gradient profile of each layer forming the thin-film, each gradient profile including a desired thinnest profile and a desired thickest profile. The method further aligns an aperture of a mask over the substrate to form the thin-film and calculates a shutter speed for the specified gradient profile of each layer across the desired area of the substrate, and deposits each layer on the substrate, through the aperture, as the aperture of the shutter moves at the calculated shutter speed from the desired thinnest profile of each layer to the desired thickest profile of each layer.

6 Claims, 7 Drawing Sheets

FIG.3(a) POSITION 1
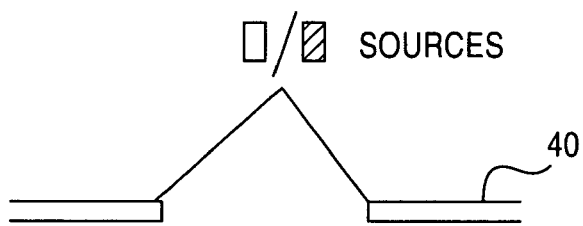
FIG.3(b) POSITION 2
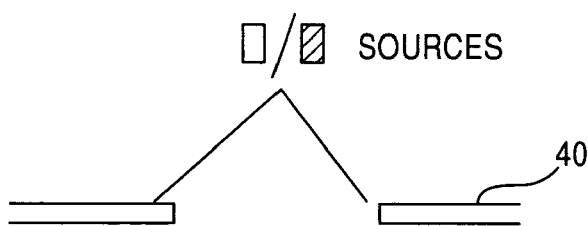
FIG.3(c) POSITION 3
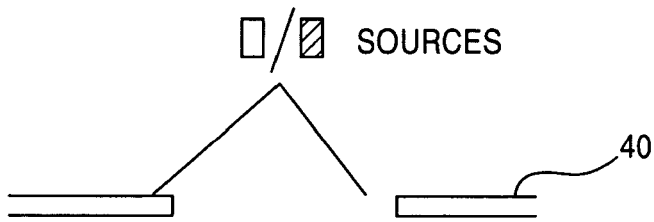
FIG.3(d) POSITION N
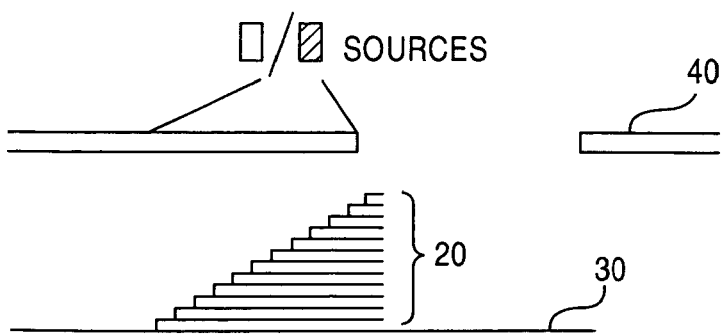

SYSTEM AND METHOD OF FABRICATION AND APPLICATION OF THIN-FILMS WITH CONTINUOUSLY GRADED OR DISCRETE PHYSICAL PROPERTY PARAMETERS TO FUNCTIONALLY BROADBAND MONOLITHIC MICROELECTRONIC OPTOELECTRONIC/SENSOR/ACTUATOR DEVICE ARRAYS

This invention was made with government support under Contract Numbers DMR0094265 and 0231291 awarded by the National Science Foundation. The government has certain rights in the invention.

BACKGROUND OF THE INVENTION

1. Field of the Invention

The present invention relates to a system and method of fabrication and application of thin-films having different physical property parameters or having physical property parameters that continuously change across functionally broadband monolithic device arrays.

2. Description of the Related Art

Device array geometries where a device in an array performs a function with slightly different specification relative to corresponding adjacent devices in the array are increasingly becoming a common configuration in microelectronic and optoelectronic applications. For instance, device arrays where individual devices are tuned to slightly different wavelengths, so that the array as a whole can emit, detect, and/or process signals at different wavelengths simultaneously are central in today's optoelectronics technology.

For instance, in optical networking wavelength division multiplexers play a key role in processing a large number of channels, which transmit signals through optical fibers. In order to detect the signals at discrete wavelengths with high spectral resolution, present systems mostly rely on arrays of waveguide gratings or thin-film filters. As the channel number continues to increase within a given bandwidth and a spectral separation between adjacent channels wavelengths become smaller, integration of a large number of detection devices becomes more difficult and expensive.

Further, spatially selective ion implantation may be used to allow synthesis of property varying thin-films using spatially selective ion implantation and to locally modify compositions and properties of the films. The spatially selective ion implantation may be used to fabricate functionally broadband device arrays. Specifically, by controlling and varying the dosage of proton and As implantations into AlGaAs/GaAs quantum well structures, a peak wavelength of photoluminescence can be continuously shifted by effectively inducing distortion in a quantum well potential. However, there are serious problems with the spatially selective ion implantation. Specifically, modification of properties by ion implantation may be accompanied by damages to the film material. Thus, a scope of what a user can achieve using ion implantation in terms of creating variation of physical properties may be limited. Also, ion implantation is an involved process requiring the use of expensive equipment.

In existing optical systems, when functionally varying devices need to be integrated and where the arrays of waveguide gratings or thin-film filters are used to handle signals at different wavelengths at the same time, in order to integrate the gratings or the thin-film filters, the gratings or the thin-film filters are "hard-wired" together. Other devices may include separately fabricated detectors that are "hard-wired" together to handle the signals or multiple lasers with different characteristic wavelengths corresponding to each signal. A system and method of fabrication are needed that provide a monolithic device or chip with multiple thin-film samples having discrete physical property parameters or with integrated continuous graded physical property parameters that would provide a compact and cost effective monolithic device.

SUMMARY OF THE INVENTION

Therefore, it is an aspect of the present invention to overcome the above described shortcomings of the prior art.

According to an aspect of the present invention, there is provided a fabrication method depositing a thin-film including layers on a substrate of a monolithic chip, the method including: defining a desired gradient profile of each layer forming the thin-film, each gradient profile including a desired thinnest profile and a desired thickest profile, wherein each layer is formed of a discrete material and is deposited onto the substrate using a corresponding source; aligning an aperture of a mask over the substrate to form the thin-film; calculating a shutter speed for the specified gradient profile of each layer across the desired area of the substrate; and depositing each layer on the substrate, through the aperture, as the aperture of the shutter moves at the calculated shutter speed from the desired thinnest profile of each layer to the desired thickest profile of each layer.

According to another aspect of the present invention, there is provided a fabrication method of a monolithic chip, the method including: depositing a single continuous composition spread thin-film on a substrate with continuous varying material components by positioning a first source and a second source at a first and second position, respectively, over the substrate, wherein the first and second sources allow deposition of first and second material components, respectively, calculating a deposition period of time of the first and second material components for the desired thickness profile of the thin-film based on a rate of emission of each source, and simultaneously depositing the first and second material components on the substrate, through the aperture, during the calculated deposition period of time using the first and second sources to form the thin-film.

According to still another aspect of the present invention, there is provided a fabrication method of a monolithic chip, the method including: depositing a single continuous composition spread thin-film on a substrate by defining a desired thickness profile of each layer forming the thin-film, wherein each layer is formed of a discrete material and is deposited onto the substrate using a corresponding source, aligning an aperture of a mask over the substrate to form the thin-film, calculating a deposition period of time for the desired thickness profile of each layer based on a rate of emission of each corresponding source, and depositing each layer for the calculated deposition period of time.

According to still another aspect of the present invention, there is provided a fabrication method of a monolithic chip, the method including: depositing a single continuous composition spread thin-film on a substrate with continuous varying material components by defining a desired thickness profile of the thin-film, defining a desired area of the substrate to form the thin-film, positioning a first source and a second source at a first and second position, respectively, over the desired area of the substrate, wherein the first and second sources allow deposition of first and second material components, respectively, calibrating a rate of emission of the first source based on an amount of the first material component to be deposited during a specified period of time to form the desired thickness profile of the layer, calibrating the rate of emission of the second source based on the amount of the second material component to be deposited in the specified period of time to form the desired thickness profile of the thin-film, calculating a deposition period of time of the first and second material components for the desired thickness profile of the thin-film based on the rate of emission of each source, and simultaneously depositing the first and second material components during the calculated deposition period of time using the first and second sources to form the thin-film.

According to still another aspect of the present invention, there is provided a fabrication method of a monolithic chip, the method including: depositing a single continuous composition spread thin-film on a substrate by defining a desired thickness profile of the thin-film, defining the desired thickness profile of each layer forming the thin-film, wherein each layer is formed of a discrete material and is deposited onto the substrate using a corresponding source, calibrating a rate of emission of each source based on an amount of the material of the corresponding layer to be deposited during a specified period of time to form the desired thickness profile of each corresponding layer, aligning an aperture of a shutter over a desired area of the substrate to form the thin-film, calculating a deposition period of time for the desired thickness profile of each layer based on the rate of emission of each corresponding source, and depositing each layer on the substrate, through the aperture, for the calculated deposition period of time.

According to still another aspect of the present invention, there is provided a fabrication method of a monolithic chip, the method including: depositing a single continuous composition spread thin-film with layers on a substrate by defining a desired thickness profile of the thin-film, defining a desired gradient profile of each layer, each gradient profile including a desired thinnest profile and a desired thickest profile, wherein each layer is formed of a discrete material and is deposited onto the substrate using a corresponding source, calibrating a rate of emission of each source based on an amount of the discrete material of the layer to be deposited during a specified period of time to form the desired gradient profile of each layer, aligning an aperture of a shutter over a desired area of the substrate to form the thin-film, calculating a shutter speed for the specified gradient profile of each layer across the desired area of the substrate, wherein the speed of the shutter is a function of the defined gradient profile, from thinnest to thickest, of the layer and the source rate of emission, and depositing each layer on the substrate, through the aperture, at the rate of emission as the aperture of the shutter moves at the calculated shutter speed from the desired thinnest profile of each layer to the desired thickest profile of each layer.

According to still another aspect of the present invention, there is provided a method of fabrication of a monolithic chip, including: forming a single continuous composition spread thin-film formed over a substrate with linearly and continuously varying physical property parameters from one end of the substrate to the other.

BRIEF DESCRIPTION OF THE DRAWINGS

Further aspects, details, advantages and modifications of the present invention will become apparent from the following detailed description of the preferred embodiments which is to be taken in conjunction with the accompanying drawings, in which:

FIGS. 3(a) to 3(d) illustrate the gradient formation of the layers in either the continuous single-film composition spread or the multiple thin-film samples, in accordance with an embodiment of the present invention;

DETAILED DESCRIPTION OF THE PREFERRED EMBODIMENTS

Reference will now be made in detail to the preferred embodiments of the present invention, examples of which are illustrated in the accompanying drawings. The present invention described below provides a monolithic chip having a single continuous composition film or having multiple film samples having discrete physical property parameters across the chip. Specifically, the monolithic chip is a compact and cost effective device having a linear and continuous varying composition either from end to end of a substrate, such as a silicon wafer or die, or having an array of different thin-film samples, the physical property parameters integrated into each sample and varying from sample to sample.

The compact integrated array configurations of the monolithic chip, in accordance with an embodiment of the present invention, allow a reduction in size and cost in the fabrication, and functional monolithic microelectronic/optoelectronic/sensor/actuator device arrays. Further, by varying the size of the monolithic chip, a spectral range and/or spectral resolution thereof can be made arbitrary high.

In general, integrated circuit processing and production techniques involve sequentially depositing or forming various layers or portions of layers onto a semiconductor substrate. These layers or portions of layers are generally formed by a series of material depositions followed by selective removal or patterning of certain portions of the deposition by photolithograph and etching.

In accordance with an embodiment of the present invention, a system and method to fabricate the monolithic chip are provided. In one embodiment, the monolithic chip may include a single thin-film deposited over an entire surface substrate, having continuous varying physical property quantity/parameters, such as energy bandgap, resistivity, thermal conductivity, thermoelectric coefficient, thermomagnetic coefficient, piezoelectric coefficient, piezomagnetic coefficient, pyroelectric coefficient, elasticity, superconductivity, magnetostrictive coefficient, magnetoresistivity, magnetic permeability, dielectric constant, nonlinear dielectric constants, or resonant frequency. The variable physical property quantity/parameters can be achieved by using a composition spread film where the composition and/or a physical property parameter are varying across the film. The substrate can be constructed of insulating materials or semiconductor material, such as silicon which is economical and easy to work with.

In the alternative, an array of thin-films may be fabricated on the monolithic chip, each thin-film having discrete physical property parameters. Also, the entire array of thin-film samples would be integrated to allow the monolithic chip to function as a "broadband" device as a whole. In many applications, the array of thin-film samples may be operated simultaneously by using multiplexing electronics.

Figure 1A:
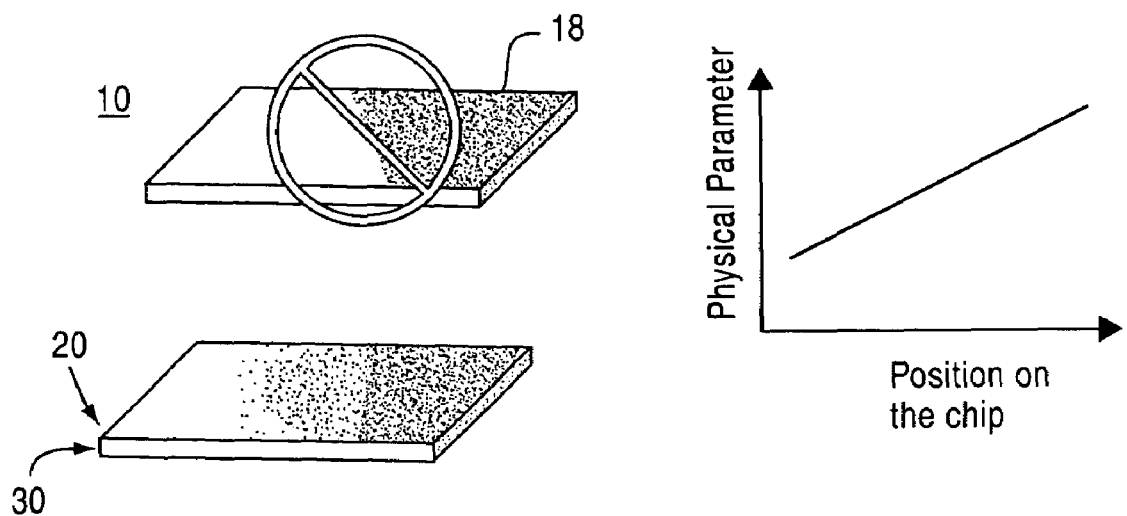
FIG. 1(a) illustrates a monolithic chip having a single continuous composition spread film with a continuously varying physical property parameter, in accordance with an aspect of the present invention.
Figure 1B:
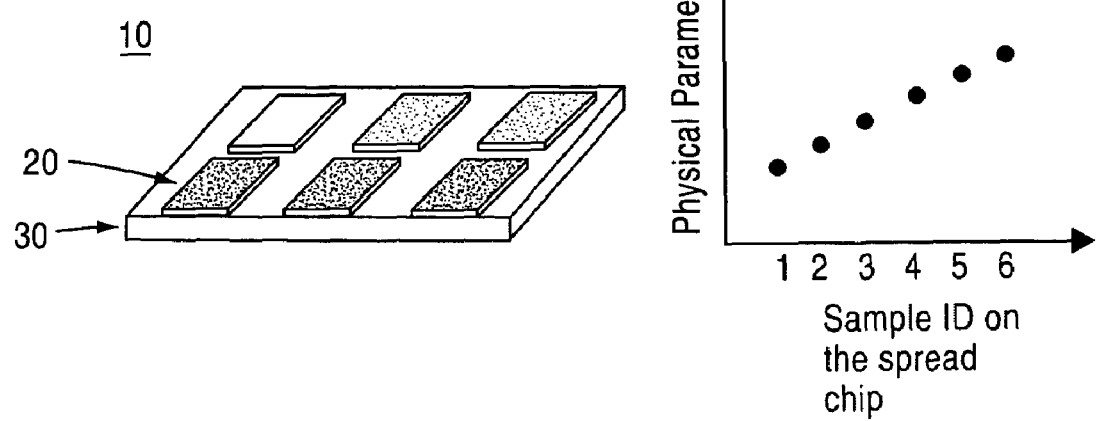
FIG. 1(b) illustrates the monolithic chip being a multi-film sample chip, in accordance with an embodiment of the present invention.

FIG. 1(a) illustrates the monolithic chip 10 having a single continuous composition spread thin-film 20 with continuously varying physical property parameters, in accordance with an embodiment of the present invention. Contrary to a thin-film 18 having a discrete composition, the thin-film 20 has a linear and continuous, uniform, or progressive varying composition from one end of the substrate 30 to the other. Alternately, FIG. 1(b) illustrates the monolithic chip 10 being a multi-film sample chip. The physical property parameters of each thin-film 20 vary from sample to sample.

Figure 2A:
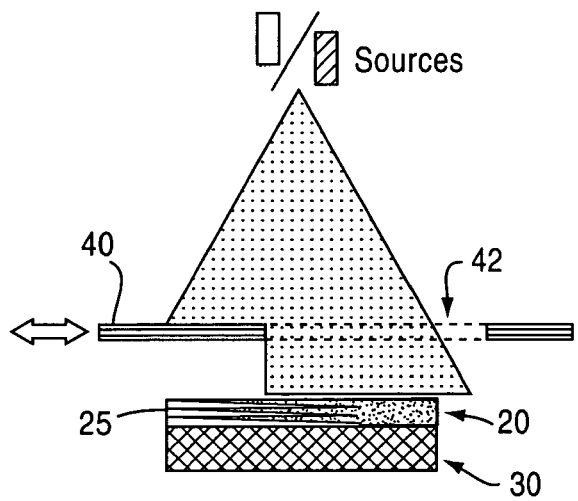
FIG. 2(a) illustrates a fabrication scheme of the monolithic chip as a continuous single-film composition spread, in accordance with an embodiment of the present invention.
Figure 2B:
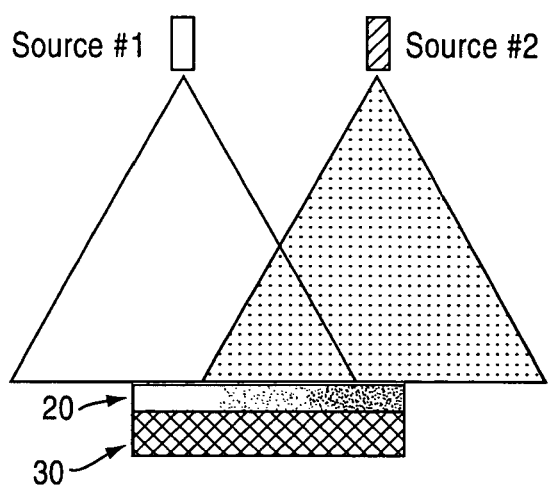
FIG. 2(b) illustrates the fabrication scheme of the monolithic chip having the continuous single-film composition spread by simultaneous co-deposition of different material components, in accordance with an embodiment of the present invention.
Figure 2C:
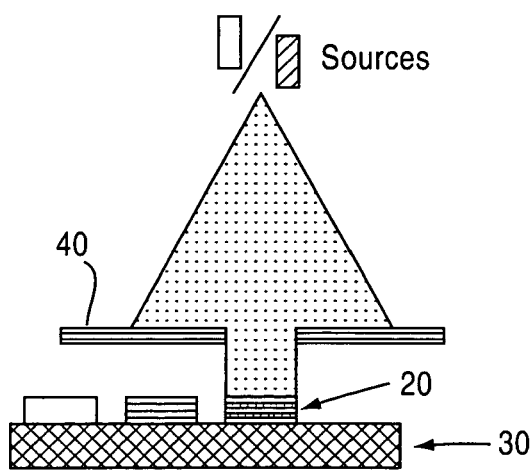
FIG. 2(c) illustrates the fabrication scheme of the monolithic chip having multiple film samples with discrete physical property parameters, in accordance with an embodiment of the present invention.

The details of the system and method of fabrication of integrated thin-films 20 with continuously graded physical property parameters, according to the present invention can be understood best with reference to FIGS. 2(a) to 2(c). A thickness of the thin-film 20 or each thin-film sample 20 may be determined by several factors including, among others, particular piezoelectric or pyroelectric properties desired, a specific application of the thin-film 20, and practical restraints associated with integrated circuit processing methods, photolithography, and micromachining techniques. For illustrative purposes, the thin-films 20 described in FIGS. 2(a) to 2(c) have a thickness of approximately half-micron and include at least one layer of material.

The thin-film composition spread may be created using spatially selective thin-film deposition by shadow deposition. For instance, FIG. 2(a) illustrates the fabrication system of the monolithic chip 10 as a continuous single-film composition spread, in accordance with an embodiment of the present invention. The fabrication system illustrated in FIG. 2(a) may be used to generate a large number of alternating material layers 25 in the thin-film 20, the layers 25 having corresponding thickness gradients (e.g., a thickness wedge) in opposite directions. In FIG. 2(a), a moving shutter or a shadow mask 40 includes at least one square aperture or through-hole 42 and moves at a continuous speed over the substrate 30. The speed of the shutter or mask 40 is a function of a specified thickness of each layer 25 to form the thin-film 20 and the source emission rate.

According to an embodiment of the present invention, the fabrication system includes at least one source that emits highly intense UV laser beams, for instance, to ablate corresponding materials to be used to form each layer 25. The substrate 30 and the moving shutter 40 are positioned in parallel planes substantially perpendicular to an optical axis of the source emitting the electrons. The shutter 40 is driven along the optical axis of the source emitting the UV laser beams. Thus, as the shutter 40 moves along the substrate 30, the aperture 42 is positioned so that the source associated with the material to be used to form a first layer 25 of the thin-film 20, focuses the UV laser beam so that the material is deposited on a desired area of the substrate 30. In the alternative, evaporation or sputtering may be executed to form the thin-films 20. This fabrication system is flexible in preparing films under a wide range of deposition conditions such as kinetic energy, deposition rate, and ambient gas.

FIG. 2(b) illustrates the fabrication scheme of the monolithic chip 10 having the single continuous composition spread thin-film 20 by simultaneous co-deposition of different material components using at least two sources positioned at opposite ends of the substrate 30, in accordance with an embodiment of the present invention. As shown in FIG. 2(b), a natural flux gradient of two material components created in the deposition of the continuous composition spread film configuration provides a desired composition gradient and a desired physical property parameter gradient in the thin-film 20.

In an exemplary embodiment, as shown in FIG. 2(b), first and second sources are enabled to simultaneously ablate first and second materials, respectively. The first source is positioned over the first end of the substrate 30 and the second source is positioned at the second end of the substrate 30. During the deposition process, maximum amounts of the first material and the second material are deposited at the first end and the second end of the substrate 30, respectively, and mixing occurs of the first and second materials. Thus, in the technique illustrated in FIG. 2(b), the co-deposition process guarantees intimate mixing of the materials in a vertical direction (i.e., thickness) of the film at each location of the continuous composition spread thin-film 20 on the substrate 30 of the monolithic chip 10.

In order to form the thin-film 20 to have a specific thickness, the first and second sources are calibrated. Once the desired thickness of the thin-film 20 is specified and a composition of the thin-film 20 is defined, such as a number of layers to form the thin-film 20, the calibration may be performed for each source corresponding to each layer 25 to form the thin-film 20. The calibration is performed for each particular source and may be done, for instance, based on an amount of a particular material of each layer 25 to be deposited during a specified period of time to form the desired thickness of the layer 25. Each source would then be calibrated by adjusting a corresponding rate of emission. Thus, the rate of emission of each source would be proportional to the thickness of each corresponding layer 25.

In accordance with an embodiment of the present invention, FIG. 2(c) illustrates the fabrication scheme of the composition spread monolithic chip 10 having multiple thin-film samples 20, each thin-film sample 20 with discrete physical property parameters. According to an embodiment of the present invention, the fabrication system includes the source and a mask allowing deposition of the materials via a through-hole or aperture 42 onto the substrate 30. The mask is positioned in a plane substantially perpendicular to the optical axis of the source. The mask is driven along the optical axis of the source. A person of ordinary skill in the art will appreciate that although one mask is used in FIG. 2(c), multiple masks may be used to form the multiple film samples from the particle emission from the source.

For the discrete multi-sample composition spread monolithic chip 10, stencil masks or moving shutters 40 are used to separate individual film samples. For one of the thin-films 20, two materials may be deposited in an alternating manner. The variation of the physical property parameter from thin-film sample 20 to thin-film sample 20 is achieved by controlling and varying a ratio of the thickness of each material component as shown in FIG. 2(c). The ratio of the thickness of each material component may vary between thin-films 20. In one embodiment of the present invention, the fabrication system may calibrate the sources so that some films may be formed only of one particular material component and other thin-films 20 may be formed of alternating material components at different ratios per film. As previously described, each source is calibrated by adjusting a corresponding rate of emission to generate the desired thickness of each corresponding layer 25.

A person of ordinary skill in the art will appreciate that although the examples illustrated in FIGS. 2(a) to 2(c) display one-dimensional binary type composition spreads, techniques described above can also be extended to multi-component spreads, such as ternary phase diagram chips. Further, as illustrated in FIGS. 2(a) to 2(c), the fabrication scheme may allow a user to select a ratio of the layers corresponding to the first and second materials when forming the thin-film 20. The ratio may vary according to a particular application and more than two materials may be selected to form the alternating layers of the thin-film 20. Further, if more than two materials are used to form the thin-film 20, the ratio of the materials may also vary depending on the application. In accordance with another embodiment of the present invention, the fabrication scheme allows the user to select a thickness or a gradient thickness for each layer 25 by calibrating the sources to then produce the thin-film 20 of a desired thickness. In other words, the thickness or the gradient thickness of the layers associated with one material may vary with the thickness or the gradient thickness of the layers associated with other materials.

FIGS. 3(a) to 3(d) illustrate the gradient formation of each layer 25 in either the continuous single-film composition spread or the multiple thin-film samples 20. Assuming, for exemplary purposes, the thin-film 20 of the monolithic chip 10 is to be formed as a continuous single-film composition spread including alternating layers 25, 27 having two types of materials, a first material and a second material. When forming a first layer 25 including the first material, at a first end of the substrate 30, a first source in the fabrication system associated with the first material is enabled to ablate the first material and a second source in the fabrication system and associated with the second material is disabled.

After determining the desired area of the substrate 30 to form the thin-film 20 and deposition of the first material begins, as shown in FIG. 3(a), at the first end of the substrate 30, the thickness of the first layer 25 is the smallest or negligible. During the deposition of the first layer 25, the shutter 40 continuously moves towards the second end of the substrate 30. As shown in FIGS. 3(b) and 3(c), as the shutter 40 is continuously moving towards the second end of the substrate 30, the shutter 40 continuously or progressively blocks the amount of first material from being deposited onto the substrate 30 and the amount of the first material being deposited to form the first layer 25 begins to increase in a gradient form. The aperture 42 is still allowing continuous accumulation of the first material towards the second end of the substrate 30. Thus, as shown in FIG. 3(d), at a position N, the shutter 40 will completely blocks the first material from being deposited and the thickness of the first layer 25 would then be the greatest. The first source is then disabled.

To begin the gradient formation of the second layer 27 including the second material, the shutter 40 would be positioned so that the aperture 42 is aligned over the first layer 25 and the shutter 40 would continuously move from the second end towards to the first end of the substrate 30. The fabrication system would enable second source to ablate the second material. The fabrication system executes the fabrication method of the second layer 27 similarly to the first layer 25, except that the second layer 27 would have an opposite thickness gradient to the first layer 25.

Furthermore, in accordance with an alternative embodiment of the present invention, rather than using the shutter 40 to form each layer 25 with the thickness gradient, the substrate 30 may be positioned in an inclined position. Although for illustrative purposes, FIGS. 3(a) to 3(d) illustrate the first layer 25 as having a gradient step form, a person of ordinary skill in the art will appreciate that the shutter 40 may be controlled to move in such a continuous fashion so as to avoid such step form. Specifically, mutual diffusion of the two layers 25, 27 between adjacent gradient wedge layers 25, 27 at an elevated temperature yields a homogenous thin-film 20 in the vertical direction (i.e., thickness). The multilayer of opposing thickness gradients result in a continuously varying (average) composition across the monolithic chip 10, and, thus, a continuously varying physical property parameter across the monolithic chip 10 can be obtained depending on the material system and their properties.

The formation of the thickness of the layers 25, 27 is controlled by the corresponding sources to be only a fraction of a unit cell of approximately $10^{-10}$ m of the intended material. Such control may be implemented using a physical vapor deposition process including the pulsed laser deposition and molecular beam epitaxy. The physical vapor deposition process is a thin-film deposition technique using a pulsed laser beam to evaporate materials and deposit thin-films 20.

Figure 4A:
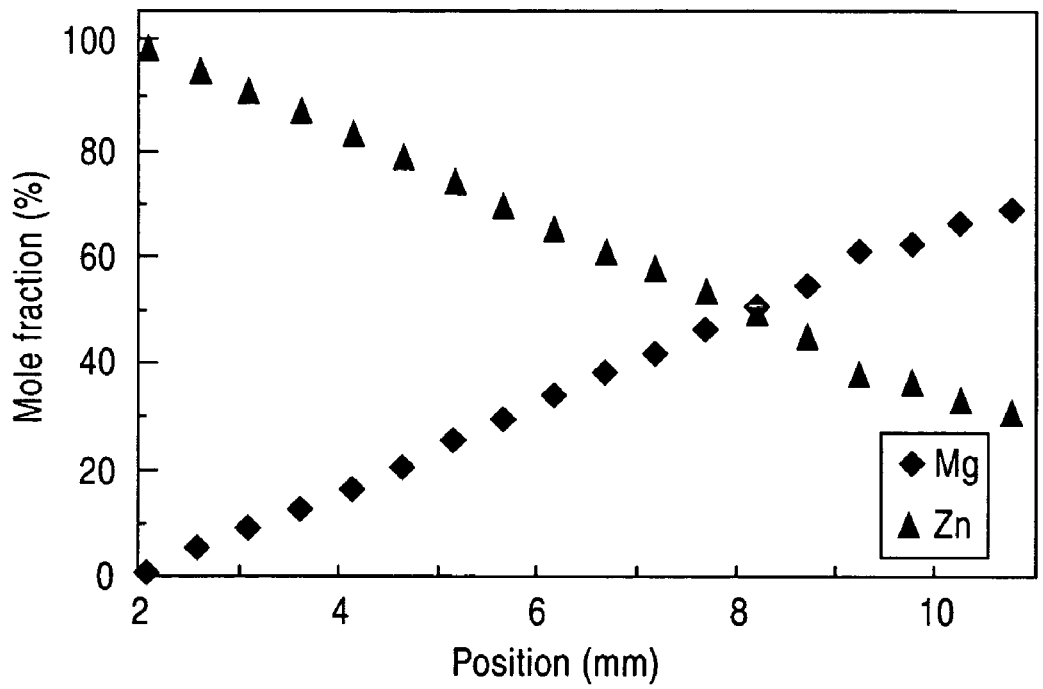
FIG. 4(a) illustrates a variation of a composition and a bandgap across a single-chip $Mg_xZn_{1-x}O$ thin-film continuous composition spread, in accordance with an embodiment of the present invention.
Figure 4B:
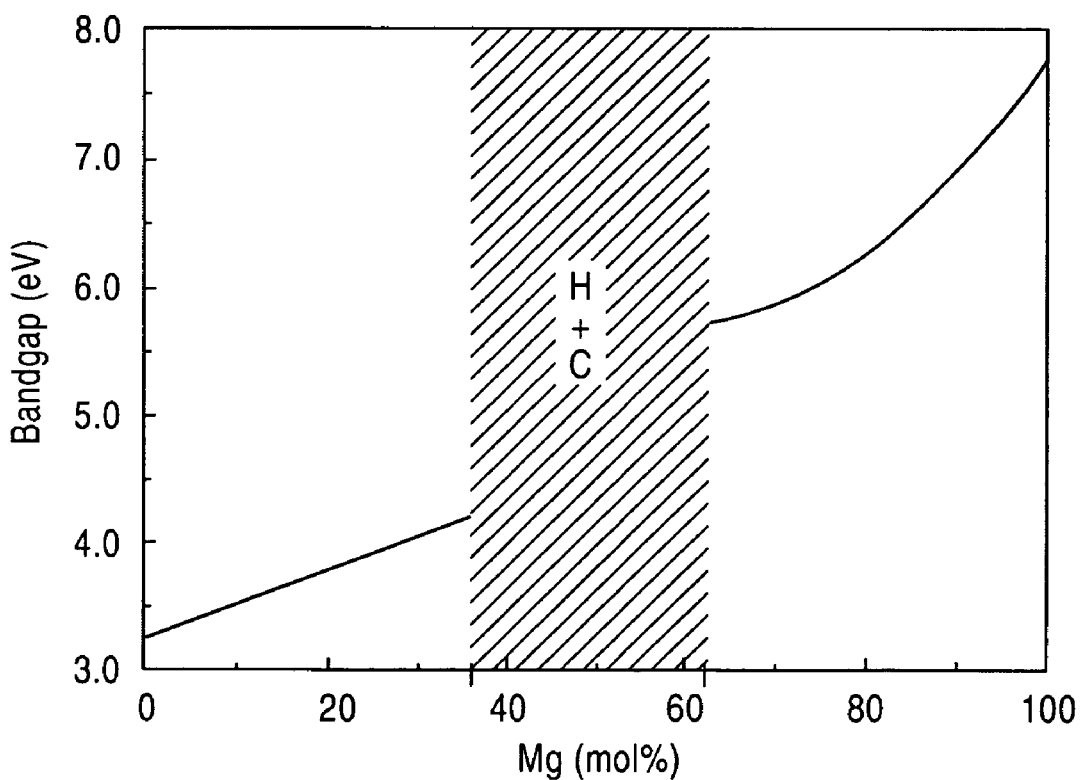
FIG. 4(b) illustrates a variation of energy bandgap across the single-chip $Mg_xZn_{1-x}O$ thin-film continuous composition spread, in accordance with an embodiment of the present invention.

FIG. 4(a) illustrates a variation of composition and bandgap across a single-chip $Mg_xZn_{1-x}O$ thin-film continuous composition spread, in accordance with an embodiment of the present invention. An example of a continuous composition spread with a varying energy bandgap film is shown in FIG. 4(b), which uses ZnO (energy bandgap 3.3 eV) and MgO (energy bandgap 7.8 eV) as the two end components. A resulting $Mg_xZn_{1-x}O$ thin-film shows a continuously changing bandgap as a function of the position on the spread. Further, FIG. 4(a) shows the continuously changing composition across a part of the $Mg_xZn_{1-x}O$ film as verified by an electron probe (composition versus position on the monolithic chip). The corresponding bandgap measured on this film is shown in FIG. 4(b). Specifically, FIG. 4(b) illustrates a variation of energy bandgap across the single-chip $Mg_xZn_{1-x}O$ thin-film continuous composition spread, in accordance with an embodiment of the present invention.

Figure 5A:
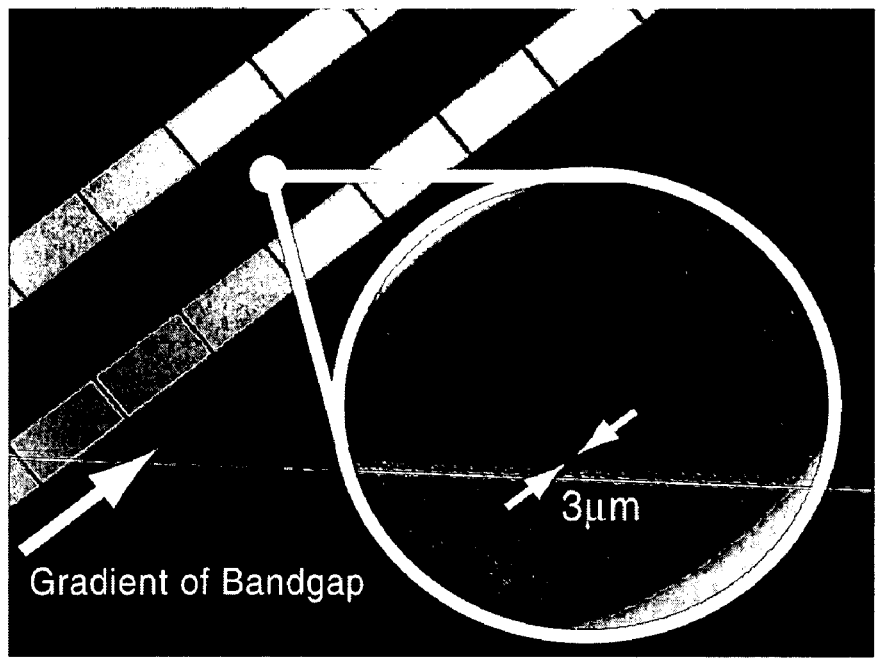
FIG. 5(a) illustrates a photograph of a monolithic $Mg_xZn_{1-x}O$ wavelength distinguishable UV photodetector array fabricated on a composition array, in accordance with an embodiment of the present invention.
Figure 5B:
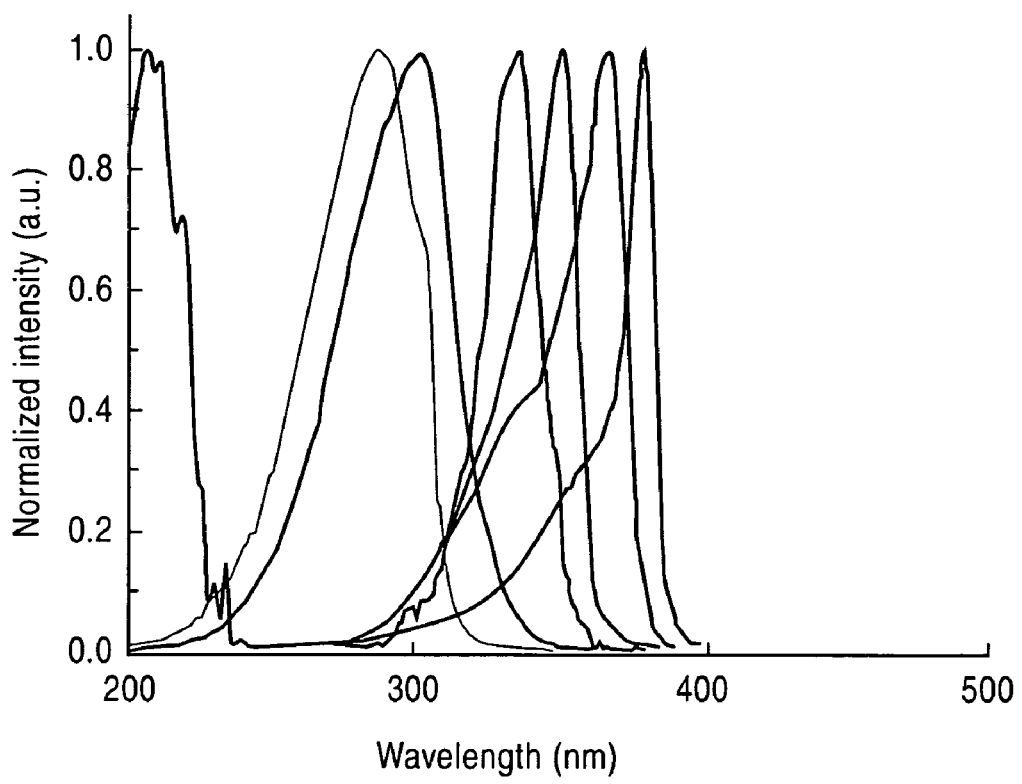
FIG. 5(b) illustrates a spectral response of the monolithic $Mg_xZn_{1-x}O$ wavelength distinguishable UV photodetector array fabricated on the composition array, in accordance with an embodiment of the present invention.

FIG. 5(a) illustrates a photograph of a monolithic $Mg_xZn_{1-x}O$ wavelength distinguishable UV photodetector array fabricated on a composition array, in accordance with an embodiment of the present invention. Shown in FIG. 5(a) is the normalized spectral response of an array of ultraviolet (UV) photodetector array based on a variable-bandgap composition spread $Mg_xZn_{1-x}O$ thin-film. FIG. 5(b) illustrates a spectral response of the monolithic $Mg_xZn_{1-x}O$ wavelength distinguishable UV photodetector array fabricated on the composition array, in accordance with an embodiment of the present invention. As a result of the continuously changing bandgap, as shown in FIG. 5(b) a peak wavelength of this detector array shifts continuously from 380 nm down to below 200 nm. Thus, in accordance with an embodiment of the present invention, a single chip may be created where different wavelength signals can be detected and distinguished. In the ultraviolet (UV) range, wavelength distinguishable detectors are much needed for a variety of medical, environmental, and military applications.

The detector array can serve as a spectrometer, which can be used to analyze the spectral distribution of incident light. FIGS. 5(a) and 5(b) show the basic operation schematic of the microspectrometer based on the variable bandgap composition spread device. The microspectrometer is an exemplary embodiment of the present invention, where a single chip contains, an array of materials with a varying physical property which are separately and simultaneously made active along a functional range, and they can be operated together as one compact integrated device. In an alternative embodiment of the present invention, the same composition spread configuration and the varying bandgap can be used to create an array of lasers or light emitting devices with different output wavelengths.

Figure 6:
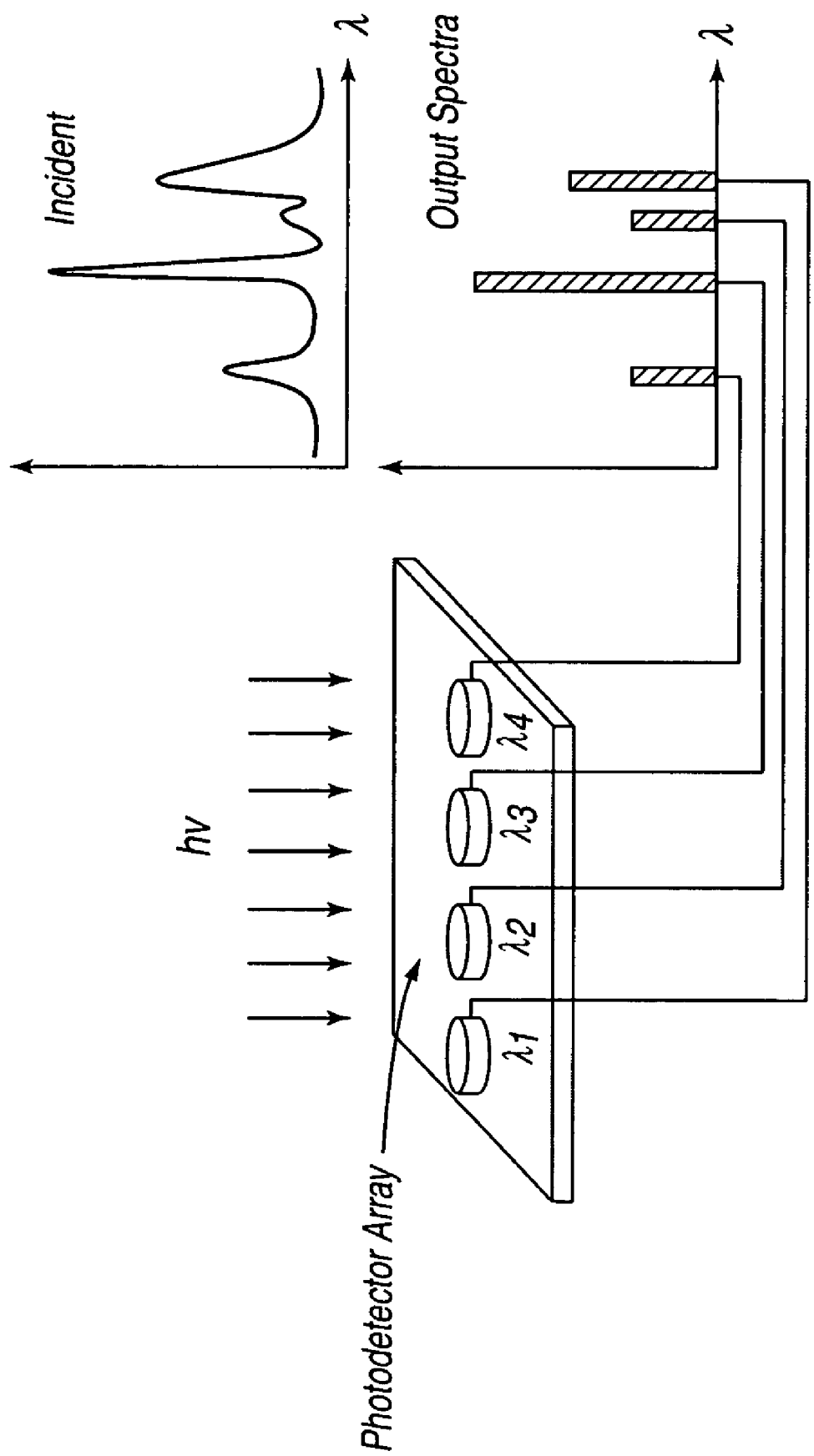
FIG. 6 illustrates a schematic view of a monolithic broadband microspectrometer based on the monolithic chip, in accordance with an embodiment of the present invention.

FIG. 6 illustrates a schematic view of a monolithic broadband microspectrometer based on the composition spread monolithic chip, in accordance with an embodiment of the present invention.

Figure 7:
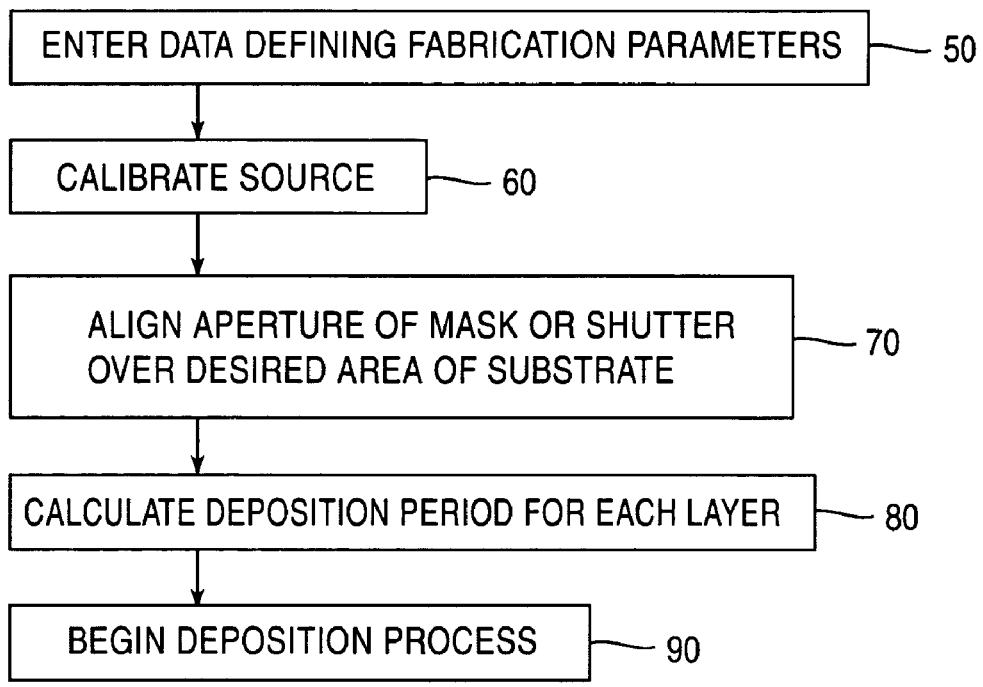
FIG. 7 illustrates a flow chart of a fabrication method of the monolithic chip having the single continuous composition spread film, in accordance with an embodiment of the present invention.

FIG. 7 illustrates a flow chart of the fabrication method of the monolithic chip 10 having the single continuous composition spread film, in accordance with an embodiment of the present invention. At operation 50, data is entered defining fabrication parameters. For instance, the data may include a desired thickness profile of each layer 25 to be formed and a desired thickness profile of the entire thin-film 20. A profile is a record of specific data that define specifications for fabrication of the thin-films 20 with continuously graded physical property parameters or with multiple discrete samples.

If the layers 25 to be deposited need the gradient thickness, in an alternative embodiment, the data may also include a desired thinnest profile (i.e., thickness of the layer 25 in the vertical direction) of each layer to be formed and a desired thickest (i.e., thickness of the layer 25 in the vertical direction) profile of each layer 25 to be formed.

At operation 60, a rate of emission of each source is calibrated based on an amount of the particular material of the layer 25 to be deposited during a specified period of time to form the desired thickness profile of the layer 25. Thus, the rate of emission of each source would be proportional to the thickness of each corresponding layer 25. The calibration of all of the sources may be done simultaneously, or may be done as each source is being prepared to deposit the corresponding layer 25.

At operation 70, the fabrication method aligns the aperture or through-hole 42 of the mask or moving shutter 40 over the desired area of the substrate 30 to form the thin-film 20. At operation 80, the fabrication method calculates a deposition period for the desired thickness profile for the layer 25 to be formed.

At operation 90, the deposition process of the layer 25 begins. During the deposition process, the material is deposited to form the layer 25 for a specific period of time, which is a function of the desired thickness profile of the layer 25 and the source emission rate. If the thin-film 20 includes more than one layer, once the deposition process for the layer is complete, the fabrication method returns to operation 70 to fabricate another layer.

Figure 8:
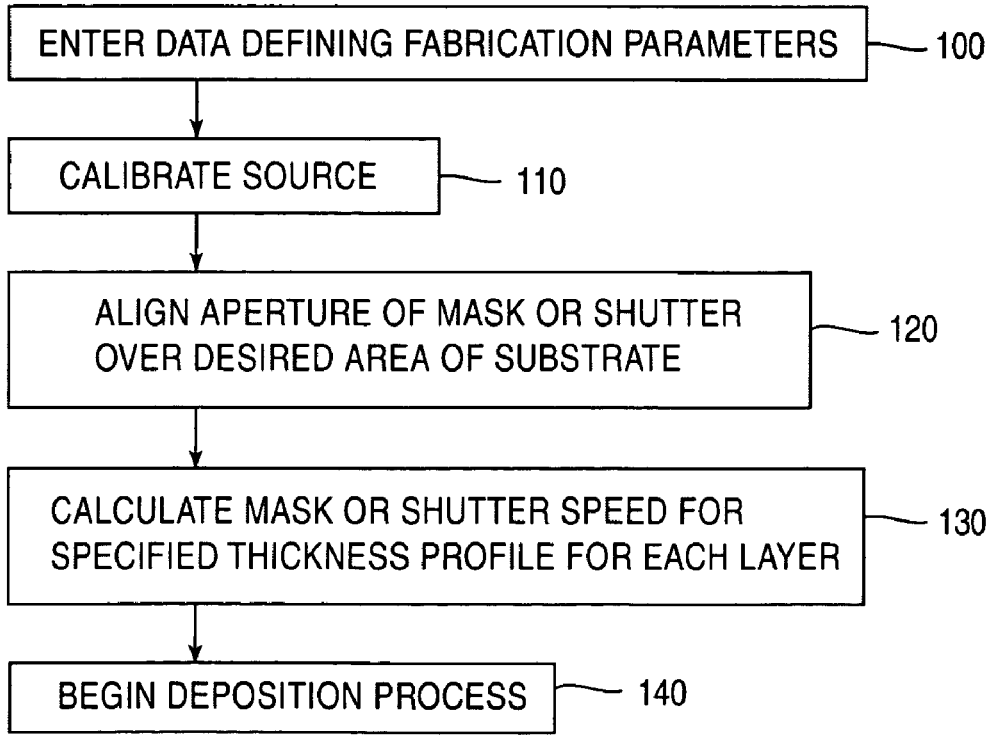
FIG. 8 illustrates a flow chart of a fabrication method of the monolithic chip having the single continuous composition spread film with the discrete physical property parameters, in accordance with an embodiment of the present invention.

FIG. 8 illustrates a flow chart of the fabrication method of the monolithic chip 10 as the single continuous composition spread film with the discrete physical property parameters, in accordance with an embodiment of the present invention. At operation 100, the data is entered defining the fabrication parameters. The data may include the type of material to be deposited, a desired gradient profile of each layer 25 including a desired thinnest profile (i.e., thickness of the layer 25 in the vertical direction) of each layer 25 to be formed and a desired thickest (i.e., thickness of the layer 25 in the vertical direction) profile of each layer to be formed, and the desired thickness profile of the entire thin-film 20.

Based on the desired thickness profile of the layer and the desired thickness profile of the entire thin-film 20, at operation 110, the rate of emission of each source is calibrated based on the amount of the particular material of the layer 25 to be deposited during the specified period of time to form the desired thickness profile of the layer 25. Thus, the rate of emission of each source would be proportional to the thickness of each corresponding layer. The calibration of all of the sources may be done simultaneously, or may be done as each source is being prepared to deposit the corresponding layer.

At operation 120, the fabrication method aligns the aperture or through-hole 42 of the mask or moving shutter 40 to the desired area of the substrate 30 to form the thin-film 20. At operation 130, the fabrication method calculates a shutter speed for the desired thickness profile of each layer across the desired area of the substrate 30. The speed of the shutter or mask 40 is a function of the desired thickness (i.e., from thinnest to thickest) profile of the layer and the source emission rate. At operation 140, the deposition process of the layer begins. During the deposition process, the deposition of the material used to form the layer continues for the determined period of time and the aperture 42 of the shutter or mask 40 moves from the desired thinnest profile of the layer to the desired thickest profile of the layer.

The fabrication methods described in FIGS. 7 and 8 may be applied in the fabrication of each thin-film sample 20 in a fabrication method of a monolithic chip 10 having multiple thin-film samples 20, in accordance with an alternative embodiment of the present invention.

Although light detection, emission and luminescence in general are some applications of the proposed composition spread devices, the scope of the fundamental concept of the present invention is far-reaching. There are a variety of other physical properties where individual component/devices can be made to have slightly different specification in a controllable way and where one can benefit from having compact integrated arrays of the component/devices on single chips. Other applications of the functionally broadband devices include spectral sensing of gases, mechanical sound and vibrations, static and dynamic electromagnetic field, temperature, force, chemical reactions (catalytic or otherwise) as well as actuation, impedance matching impedance matching, thermal conductivity, thermoelectric effect, thermomagnetic effect, magnetostriction, piezoelectricity, piezomagnetism, pyroelectricity, elasticity, superconductivity, magnetostrictive coefficient, magnetoresistivity, magnetocaloric effect, optical non-linearity, and magnetic permeability. The present invention may encompass all functionalities of materials where the functionality has a parameter to be varied in a continuous way.

Thus, in accordance with an aspect of the present invention, a system and process are provided to fabricate and apply thin-films with continuously graded or discrete physical property parameters to functionally broadband monolithic microelectronic optoelectronic/sensor/actuator device arrays. The fabrication method provides a reduction in size and cost in the fabrication of assembly of the device arrays.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A fabrication method of a monolithic chip, the method comprising:
   depositing a single continuous composition spread thin-film with layers on a substrate by
   defining a desired thickness profile of the thin-film,
   defining a desired gradient profile of each layer, each gradient profile comprising a desired thinnest profile and a desired thickest profile, wherein each layer is formed of a discrete material and is deposited onto the substrate using a corresponding source,
   calibrating a rate of emission of each source based on an amount of the discrete material of the layer to be deposited during a specified period of time to form the desired gradient profile of each layer,
   aligning an aperture of a shutter over a desired area of the substrate to form the thin-film,
   calculating a shutter speed for the specified gradient profile of each layer across the desired area of the substrate, wherein the speed of the shutter is a function of the defined gradient profile, from thinnest to thickest, of the layer and the source rate of emission, and
   depositing each layer on the substrate, through the aperture, at the rate of emission as the aperture of the shutter moves at the calculated shutter speed from the desired thinnest profile of each layer to the desired thickest profile of each layer.

2. The method as recited in claim 1, further comprising: performing the calibration of the sources simultaneously.

3. The method as recited in claim 1, further comprising: performing the calibration as each source is being prepared to deposit the corresponding layer.

4. The method as recited in claim 1, wherein the deposition of the layers comprises:
   forming the layers with corresponding gradient profiles in opposite directions.

5. The method as recited in claim 1, further comprising: mutually diffusing the materials between adjacent gradient wedge layers at an elevated temperature to produce the thin-film of a homogeneous thickness.

6. A method of fabrication of a monolithic chip, comprising:
   forming a single continuous composition spread thin-film over a substrate with linearly and continuously varying physical property parameters from one end of the substrate to the other, wherein the thin-film comprises an $Mg_xZn_{1-x}O$ composition.

* * * * *